United States Patent
Yang et al.

(10) Patent No.: US 12,221,515 B2
(45) Date of Patent: Feb. 11, 2025

(54) OPTICALLY CLEAR RESIN COMPOSITION, FLEXIBLE OPTICAL FILM AND IMAGE DISPLAY DEVICE

(71) Applicant: Ares Materials Inc., Dallas, TX (US)

(72) Inventors: Kejia Yang, Santa Clara, CA (US); Radu Reit, Carrollton, TX (US)

(73) Assignee: Ares Materials Inc., Dallas, TX (US)

( * ) Notice: Subject to any disclaimer, the term of this patent is extended or adjusted under 35 U.S.C. 154(b) by 922 days.

(21) Appl. No.: 16/973,540

(22) PCT Filed: Dec. 9, 2019

(86) PCT No.: PCT/US2019/065281
§ 371 (c)(1),
(2) Date: Dec. 9, 2020

(87) PCT Pub. No.: WO2021/118525
PCT Pub. Date: Jun. 17, 2021

(65) Prior Publication Data
US 2021/0363304 A1 Nov. 25, 2021

(51) Int. Cl.
| | | |
|---|---|---|
| C08G 75/04 | (2016.01) | |
| C08G 75/045 | (2016.01) | |
| C08J 5/18 | (2006.01) | |
| C08K 5/13 | (2006.01) | |
| C08K 5/523 | (2006.01) | |

(52) U.S. Cl.
CPC .............. *C08G 75/045* (2013.01); *C08J 5/18* (2013.01); *C08K 5/13* (2013.01); *C08K 5/523* (2013.01); *C08J 2381/02* (2013.01); *C08K 2201/014* (2013.01)

(58) Field of Classification Search
None
See application file for complete search history.

(56) References Cited

U.S. PATENT DOCUMENTS

| | | | | |
|---|---|---|---|---|
| 5,977,276 A | * | 11/1999 | Toh | G02B 1/041 526/292.3 |
| 6,310,161 B1 | * | 10/2001 | Weissman | G02B 1/041 526/323.2 |
| 6,313,251 B1 | * | 11/2001 | Toh | G02B 1/04 526/321 |
| 6,391,983 B1 | * | 5/2002 | Bateman | G02B 1/041 |
| 7,767,728 B2 | * | 8/2010 | Lu | C09D 151/003 522/178 |
| 8,901,196 B2 | * | 12/2014 | Hirayama | C08F 265/06 522/118 |
| 8,962,709 B2 | * | 2/2015 | Bowman | C08F 222/1025 522/42 |
| 9,303,123 B2 | * | 4/2016 | Kurata | C09K 3/1012 |
| 9,753,431 B2 | * | 9/2017 | Xie | C08F 2/50 |
| 10,615,191 B2 | * | 4/2020 | Reit | B05D 3/007 |
| 11,015,007 B2 | * | 5/2021 | Onishi | C08F 222/1006 |
| 11,090,835 B2 | * | 8/2021 | Fong | C09D 5/00 |
| 2005/0187344 A1 | | 8/2005 | Wilkey et al. | |
| 2017/0338254 A1 | | 11/2017 | Reit et al. | |
| 2023/0287207 A1 | * | 9/2023 | Park | C08L 23/12 525/95 |

FOREIGN PATENT DOCUMENTS

| | | | | |
|---|---|---|---|---|
| CN | 114563920 A | * | 5/2022 | ........... G03F 7/0045 |
| WO | WO-0064956 A1 | * | 11/2000 | ............. C08F 212/34 |
| WO | WO-2006055409 A2 | * | 5/2006 | ............. B82Y 30/00 |

OTHER PUBLICATIONS

L. Lecamp et al. Photoinitiated cross-linking of a thiol-methacrylate system. Polymer 42 (2001) 2727-2736 (Year: 2001).*
Siderido et al. Study of water sorption, solubility and modulus of elasticity of light-cured dimethacrylate-based dental resins. Biomaterials 24 (2003) 655-665 (Year: 2003).*
Mat Isa et al. Optical properties of conjugated polymer: review of its change mechanism for ionizing radiation sensor. Polymers for Advanced Technologies, 2017, 28 1559-1571 (Year: 2017).*
Esfandiari et al. Efficient stabilization of Thiol-ene Formulations in Radical Photopolymerization. Journal of Polymer Science: Part A, Polymer Chemistry, 2013, 51, 4261-4266. (Year: 2013).*
International Search Report and Written Opinion issued Feb. 20, 2020 in related International Application No. PCT/US2019/065281.
Bagheri, A, et al., Photopolymerization in 3D Printing, ACS Publication, Applied Polymer Materials, Feb. 20, 2019, vol. 1; pp. 593-611. School of Chemical Sciences, The University of Auckland, Auckland 1010, New Zealand.

* cited by examiner

Primary Examiner — Sanza L. McClendon
(74) Attorney, Agent, or Firm — McGuire Woods LLP

(57) ABSTRACT

A photocurable resin composition for forming an optically clear film. The photocurable resin composition includes a polyfunctional thiol monomer comprising 2 thiol functional groups, a polyfunctional (meth)acrylate monomer comprising 2 (meth)acryloyl functional groups, a photo-initiator present in a concentration of about 1 parts per hundred (phr) or less, a sterically hindered phenolic antioxidant present in a concentration of about 5 phr or less, and a phosphite antioxidant present in a concentration of about 5 phr or less.

18 Claims, No Drawings

OPTICALLY CLEAR RESIN COMPOSITION, FLEXIBLE OPTICAL FILM AND IMAGE DISPLAY DEVICE

TECHNICAL FIELD

The present disclosure relates to an optically clear resin composition, a flexible optical film, and an image display device.

BACKGROUND

The trend of lighter, thinner, more stretchable and flexible plastic-based electronic devices has been growing in recent years, demanding significant innovation in material development for this application. Currently, a variety of optical films are available on the market to replace rigid substrate materials for flexible display applications, such as polyethylene terephthalate (PET), polybutylene naphthalate (PBN), polyimide (PI), colorless polyimide (CPI), cyclic olefin polymers (COPs). Even though generally these films have high transmittance in the visible spectrum and low haze, they are still unsatisfactory for optical films applications in image display devices. PET and PBN tend to have high birefringence; the mechanical properties of COPs usually do not meet the flexibility specification of flexible applications; the process to manufacture the CPI is difficult and expensive, while yielding a yellow film with high birefringence. Thus, a photocurable optically clear resin is desirable to produce a flexible optical film with high transparency, low haze, low color, low birefringence, high thermal-, photo-, and hydrolytical stability in a low-cost manufacturing process for image display device.

BRIEF SUMMARY

Described herein is a photocurable, optically clear resin composition comprising polyfunctional thiol monomers and polyfunctional (meth)acrylate monomers. Additionally, a flexible optical film is described formed by the actinic radiation curing of the photocurable, optically clear resin with a total transmittance of at least 90% within the visible spectrum, a yellowness index of less than 1, a haze less than 1%, and a retardation in thickness direction less than 10 nm. Finally, a display device is described including the flexible optical film formed by curing the photocurable resin.

An example photocurable resin composition for forming an optically clear film is provided. The example photocurable resin composition comprises a polyfunctional thiol monomer comprising 2 thiol functional groups, a polyfunctional (meth)acrylate monomer comprising 2 (meth)acryloyl functional groups, a photo-initiator present in a concentration of about 1 parts per hundred (phr) or less, a sterically hindered phenolic antioxidant present in a concentration of about 5 phr or less, and a phosphite antioxidant present in a concentration of about 5 phr or less.

Additionally or alternatively, the photocurable resin composition may include one or more of the following features individually or in combination. The optically clear resin composition may further comprise a solvent at a level between 10 phr and 600 phr. The solvent may be a polar aprotic solvent, a polar protic solvent, a nonpolar solvent, or a combination thereof. The optically clear resin composition may further comprise nanoscale fillers at a level less than 2 phr. The nanoscale fillers may be reactive inorganic nanoparticles, inert inorganic nanoparticles, or a combination thereof. The optically clear resin composition may further comprise a carbodiimide agent at a level less than 5 phr. The carbodiimide agent may be a monomeric carbodiimide compound which contains one carbodiimide group per molecule, a polycarbodiimide compound which contains more than one carbodiimide group per molecule or a combination thereof. The optically clear resin composition may further comprise a chain transfer agent at a level less than 10 phr. The chain transfer agent may be an alkyl thiol, an allyl sulfide, an allyl sulfone, a halogen compound, or a combination thereof. An optically clear article may be formed by the actinic radiation curing of the photocurable resin composition.

An optical film formed by the actinic radiation curing of a photocurable resin is provided. The optical film comprises a polyfunctional thiol monomer comprising 2 thiol functional groups, a polyfunctional (meth)acrylate monomer comprising 2 (meth)acryloyl functional groups, a photo-initiator present in a concentration of about 1 parts per hundred (phr) or less, a sterically hindered phenolic antioxidant present in a concentration of about 5 phr or less, and a phosphite antioxidant present in a concentration of about 5 phr or less.

Additionally or alternatively, the optical film may include one or more of the following features individually or in combination. The polyfunctional (meth)acrylate monomers may yield a cured (meth)acrylic polymer with a modulus greater than 1 GPa at 20° C. The polyfunctional (meth)acrylate monomers may yield a cured (meth)acrylic with a dry glass transition temperature above 100° C. The mole ratio of total thiol groups from the polyfunctional thiol monomers to the total (meth)acrylate groups from the polyfunctional (meth)acrylate monomers may be greater than 0.2. The mass fraction of conjugated segments on the polymer chain may be less than 25%. The degree of the crystallinity of the optical film may be less than 50%. The mass fraction of ordered polymer structures of the optical film may be less than 50%.

A display device is provided. The display device comprises an optical film formed by curing a photocurable resin, wherein the photocurable resin comprises: a polyfunctional thiol monomer comprising 2 thiol functional groups, a polyfunctional (meth)acrylate monomer comprising 2 (meth)acryloyl functional groups, a photo-initiator present in a concentration of about 1 parts per hundred (phr) or less, a sterically hindered phenolic antioxidant present in a concentration of about 5 phr or less, and a phosphite antioxidant present in a concentration of about 5 phr or less.

DETAILED DESCRIPTION

The present disclosure relates to a photocurable, optically clear resin composition, an optically clear flexible film, and an image display device.

The first aspect of the present disclosure provides a photocurable, optically clear resin composition comprising a polyfunctional thiol monomer which has at least 2 thiol functional groups, and a polyfunctional (meth)acrylate monomer. The polyfunctional (methacrylate) monomer has at least 2 (meth)acryloyl functional groups. The resin composition further comprises a photo-initiator, a hindered phenolic antioxidant, and a phosphite antioxidant. The photo-initiator may be present in the composition at a level less than 1 parts per hundred (phr). The hindered phenolic antioxidant may be present in the composition at a level less than 5 phr. The phosphite antioxidant may be present in the composition at a level less than 5 phr.

The polyfunctional thiol monomer may be represented by the following chemical formula (1):

$$R\text{—}(SH)_x. \tag{1}$$

The R group in (1) may be an alkyl group, an alkoxyl group, a single cycloalkyl group, a complex cycloalkyl group, an acryl group, an alkoxyl group, a heterocyclic group, a heteroatom-containing alkyl group, or a combination thereof. The value of x in (1) may be 2, 3, 4, or more. Specific examples of the polyfunctional thiol monomers may include, but are not limited to, trimethylolpropane tris(3-mercaptopropionate); trimethylolpropane tris(2-mercaptoacetate); pentaerythritol tetrakis(2-mercaptoacetate); pentaerythritol tetrakis(3-mercaptopropionate); 1,4-bis(3-mercaptobutylyloxy) butane; 2,2'-(ethylenedioxy)diethanethiol; 1,3-propanedithiol; 1,2-ethanedithiol; 1,4-butanedithiol; tris[2-(3-mercaptopropionyloxy)ethyl] isocyanurate; 3,4-ethylenedioxythiophene; 1,10-decanedithiol; tricyclo[5.2.1.0$^{2,6}$]decanedithiol; benzene-1,2-dithiol; pentaerithrytol tetrakis(3-mercaptobutylate); 1,3,5-tris(3-mercaptobutyloxyethyl)-1,3,5-triazine-2,4,6-(1H, 3H, 5H)-trione; trithiocyanuric acid; dipentaerythritol hexakis(3-mercaptopropionate); 2,3-di((2-mercaptoethyl)thio)-1-propanethiol; dimercaptodiethylsulfide; ethoxylated trimethylpropan-tri(3-mercapto-propionate); ethoxylated trimethylpropantri(3-mercapto-propionate); polycaprolactone tetra 3-mercaptopropionate; di-pentaerythritolhexakis (3-mercaptopropionate); di-trimethylolpropanetetra (3-mercaptopropionate); glycoldi (3-mercaptopropionate); pentaerythritoltetramercaptoacetate; trimethylol-propanetrimercaptoacetate; and glycoldi-mercaptoacetate; any derivatives thereof; or any combination thereof.

The polyfunctional (meth)acrylate monomer in the photocurable optically clear resin composition as disclosed herein may be represented by the following chemical formula (2):

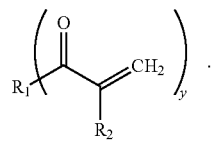

$$\tag{2}$$

The $R_1$ group in (2) may be an alkyl group, an alkoxyl group, a single cycloalkyl group, a complex cycloalkyl group, an acryl group, an alkoxyl group, a heterocyclic group, a heteroatom-containing alkyl group, or a combination thereof. The $R_2$ group may be a methyl group or a hydrogen atom. The value of y in (2) may be 2, 3, 4, or more. Specific examples of the polyfunctional (meth)acrylate monomer may include, but are not limited to, 1,3,5-triacryloylhexahydro-1,3,5-triazine, tris[2-(acryloyloxy)ethyl]isocyanurate; trimethylolpropane triacrylate; trimethylolpropane trimethacrylate; trimethylolpropane ethoxylate triacrylate; trimethylolpropane propoxylate triacrylate; tricyclo[5.2.1.0$^{2,6}$]decanedimethanol diacrylate; tricyclo[5.2.1.0$^{2,6}$] decanedimethanol dimethacrylate; pentaerythritol triacrylate; pentaerythritol trimethacrylate pentaerythritol tetraacrylate; pentaerythritol tetramethacrylate; di(trimethylolpropane) tetraacrylate; dipentaerythritol penta-/hexaacrylate; any derivatives thereof; or any combination thereof.

Photo-initiators are molecules that absorb photons upon actinic radiation and form reactive species out of the excited state, which initiate the polymerization. The initiating species may be radicals, cations, or anions. The photo-initiator in the photocurable optically clear resin composition as disclosed herein may comprise an acylphosphine oxide represented by the following chemical formula (3):

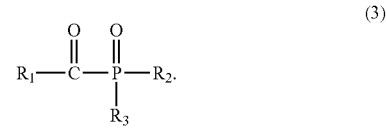

$$\tag{3}$$

The $R_1$ group in (3) may be an alkyl group, an aryl group, an alkoxyl group, a heteroatom-containing group, a cycloalkyl group, a cycloalkoxyl group, or a combination thereof. The $R_2$ group in (3) may be a phenyl group, a substituted phenome group, a hydroxyl group, The $R_3$ group in (3) may be a phenyl group, an alkyl group, an aryl group, an alkoxyl group, a heteroatom-containing group, a cycloalkyl group, a cycloalkoxyl group, or a combination thereof.

The photo-initiator may alternatively comprise an aryl alkyl ketone represented by the following chemical formula (4):

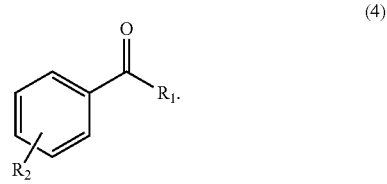

$$\tag{4}$$

The $R_1$ group in (4) may be an alkyl group, an aryl group, an alkoxyl group, a heteroatom-containing group, a cycloalkyl group, a cycloalkoxyl group, an ester group, a hydroxy group, or a combination thereof. The $R_2$ group in (4) may be a hydrogen atom, an alkyl group, an alkoxyl group, a heteroatom-containing group, a cycloalkyl group, a cycloalkoxyl group, an ester group, a hydroxy group, or a combination thereof.

In some embodiments, the photo-initiator may comprise a combination of photo-initiators, for example, a combination of an acylphosphine oxide represented by formula (3) and an aryl alkyl ketone represented by formula (4).

Specific examples of the photo-initiators may include, but are not limited to, diphenyl(2,4,6-trimethylbenzoyl)phosphine oxide; Ethyl(2,4,6-trimethylbenzoyl)-phenyl phosphinate; phenylbis(2,4,6-trimethylbenzoyl)phosphine oxide; bis(2,6-dimethoxybenzoyl)-2,4,4-trimethyl-pentyl phosphine oxide; 2-hydroxy-2-methylpropiophenone; 1-hydroxycyclohexyl phenyl ketone; cyclohexyl phenyl ketone; 2,2-dimethoxy-2-phenylacetophenone; methyl-2-benzoylbenzoate; 2-hydroxy-4'-(2-hydroxyethoxy)-2-methylpropiophenone; 2-benzyl-2-(dimethylamino)-4'-morpholinobutyrophenone; 2-methyl-4'-(methylthio)-2-morpholinopropiophenone; 2-di methylamino-2-(4-methylbenzyl)-1-(4-morpholin-4-yl-phenyl)-butan-1-one; methylbenzoylformate; a mixture of Blend of oxy-phenylacetic acid 2-[2-oxo-2-phenyl-acetoxyethoxy]-ethyl ester and oxy-phenyl-acetic acid 2-[2-hydroxyethoxy]-ethyl ester; any derivatives thereof; or any combination thereof.

In some embodiments, the photo-initiator may additionally comprise a co-initiator of an amine synergist. An amine synergist may act as active hydrogen donor for the main excited photo-initiators to generate radicals and reduce oxygen inhibition. The amine synergist may be presented by the following formula (5):

(5)

The $R_1$ group in (5) may be an alkyl group, an aryl group, an alkoxyl group, a heteroatom-containing group, a cycloalkyl group, a cycloalkoxyl group, an ester group, a or a combination thereof. The $R_2$ group in (5) may be an alkyl group, an aryl group, an alkoxyl group, a heteroatom-containing group, a cycloalkyl group, a cycloalkoxyl group, an ester group, a or a combination thereof. The $R_3$ group in (5) may be an alkenyl group, an alkyl group, an aryl group, an alkoxyl group, a heteroatom-containing group, a cycloalkyl group, a cycloalkoxyl group, an ester group, a hydroxy group, or a combination thereof. Specific examples of the amine synergist may include, but are not limited to, 2-ethylhexyl-(4-N,N-dimethyl amino)benzoate; ethyl-4-(dimethylamino)benzoate; triethanol amine; triethanol amine zirconate; any derivatives thereof; or any combination thereof.

Sterically hindered phenolic antioxidants may be used to stabilize the resin and increase the shelf life. They are radical scavengers, by converting peroxy radicals into hydroperoxides and themselves being converted to phenoxy radicals. The sterically hindered phenolic antioxidants in the photocurable optically clear resin composition as disclosed herein may be represented by the following chemical formula (6):

(6)

The R group in (6) may be an alkyl group, an aryl group, an alkoxyl group, a heteroatom-containing group, a cycloalkyl group, a cycloalkoxyl group, an ester group, an (meth) acrylate group, or a combination thereof. The value of z in (6) may be 1, 2, 3, or more. Specific examples of the sterically hindered phenolic antioxidants may include, but are not limited to, methoxyphenol; 4-tert-butylphenol; methylhydroquinone; benzenepropanoic acid, 3,5-bis(1,1-dimethylethyl)-4-hydroxy-, C7-9-branched alkyl esters; trihydroxybenzene; any derivatives thereof; or any combination thereof.

Phosphite antioxidants may be used for providing thermal stability of the articles formed by the curing of the photocurable resins. They are hydroperoxide-decomposing secondary antioxidants. The phosphite antioxidants in the photocurable optically clear resin composition as disclosed herein may be presented by the following chemical formula (7):

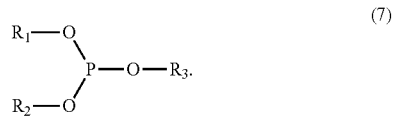

(7)

The $R_1$ group in (7) may be an alkyl group, an aryl group, an alkoxyl group, a heteroatom-containing group, a cycloalkyl group, a cycloalkoxyl group, an ester group, or a combination thereof. The $R_2$ group in (7) may be an alkyl group, an aryl group, an alkoxyl group, a heteroatom-containing group, a cycloalkyl group, a cycloalkoxyl group, an ester group, or a combination thereof. The $R_3$ group in (7) may be an alkyl group, an aryl group, an alkoxyl group, a heteroatom-containing group, a cycloalkyl group, a cycloalkoxyl group, an ester group, or a combination thereof. Specific examples of the phosphite antioxidants may include, but are not limited to, tris(2,4-di-tert-butylphenyl) phosphite; 3,9-bis(2,4-dicumylphenoxy)-2,4,8,10-tetraoxa-3,9-diphosphaspiro[5.5]undecane; 3,9-bis(octadecyloxy)-2,4,8,10-tetraoxa-3,9-diphosphaspiro[5.5]undecane; tris(nonylphenyl) phosphite; tris(2-ethylhexyl) phosphite; triethyl phosphite; triphenyl phosphite; tris(p-cresyl) phosphite; tridecyl phosphite; trilauryl phosphite; tris(tridecyl) phosphite; diphenyl mono(2-ethylhexyl) phosphite; diphenyl monodecyl phosphite; diphenyl mono(tridecyl) phosphite; tetraphenyl dipropyleneglycol diphosphite; tetra(C12-C15 alkyl)-4,4'-isopropylidene diphenyl diphosphite; 4,4'-butylidenebis(3-methyl-6-tert-butylphenyl ditridecyl phosphite); bis(tridecyl)pentaerythritol diphosphite/bis(nonylphenyl)pentaerythritol diphosphate; bis(decyl)pentaerythritol diphosphite; bis(tridecyl)pentaerythritol diphosphite; tristearyl phosphite; distearyl pentaerythritol diphosphite; tris(2,4-di-tert-butylphenyl)phosphite; hydrogenated bisphenol a pentaerythritol phosphite polymer; any derivatives thereof; or any combination thereof.

In some optional embodiments, the photocurable optically clear resin composition may further comprise a solvent at a level between 10 phr and 600 phr. In some optional embodiments, the solvent may be a polar aprotic solvent, a polar protic solvent, a nonpolar solvent, or a combination thereof.

In some optional embodiments, the photocurable optically clear resin composition as disclosed herein may further comprise nanoscale fillers at a level less than 2 phr. In some optional embodiments, the nanoscale fillers may be reactive inorganic nanoparticles, inert inorganic nanoparticles, or a combination thereof.

In some optional embodiments, the photocurable optically clear resin composition as disclosed herein may further comprise a carbodiimide agent at a level less than 5 phr. A carboiimide agent is a chemical compound that contains one or more carbodiimide groups. In some optional embodiments, the carbodiimide agent may be a monomeric carbodiimide compound which contains one carbodiimide group per molecule, a polycarbodiimide compound which contains more than one carbodiimide group per molecule, or a combination of carbodiimide compounds.

In some optional embodiments, the photocurable optically clear resin composition as disclosed herein may further comprise a chain transfer agent at a level less than 10 phr. Chain transfer agents may be used to control the polymer chain propagation to achieve certain mechanical properties. In some optional embodiments, the chain transfer agent may be an alkyl thiol, an allyl sulfide, an allyl sulfone, a halogen compound, or a combination thereof.

In some embodiments, a flexible optical article may be formed by the actinic radiation curing of a photocurable optically clear resin composition as disclosed herein. In one specific example, the photocurable optically clear resin may be dispensed onto a 2D or a 3D structure, which is then exposed to a UV source to form a conformal coating. In some optional embodiments, a prebaking procedure may be performed before the UV exposure. In some optional embodiments, a thermal annealing is followed after the UV exposure.

A flexible optical film may be formed by the actinic radiation curing of a photocurable optically clear resin composition as disclosed herein.

In some optional embodiments, a flexible optical film may be formed on a temporary carrier film. In one specific example, the photocurable optically clear resin may be dispensed onto the carrier film, which is then exposed to a UV source to form a covalently crosslinked flexible optical film. In some specific embodiments, the material of the carrier which the photocurable optically clear resin is dispensed on may be glass, silicon wafer, polyimide (PI), polyethylene terephthalate (PET), or a combination of materials. In some specific embodiments, the procedure of forming a flexible optical film may be done in a sheet-to-sheet fashion, in a continuous roll-to-roll fashion, or any combination of procedures. In some specific embodiments, the dispensing of the photocurable optically clear resin may be done via blade coating, slot die coating, spin coating, or any combination of procedures. In some optional embodiments, a prebaking procedure may be performed before the UV exposure. In some optional embodiments, a thermal annealing is followed after the UV exposure.

The photocurable optically clear resin as disclosed herein may produce an optical film comprising a degree of the crystallinity at less than 50%, a mass fraction of conjugated segments on the polymer at less than 25%, and a mass fraction of ordered polymer structures of the optical film at less than 50%; such that the flexible optical film as disclosed herein may be transparent. Specifically, the total transmittance (TT) of the film may be at least 90%, preferably 92%, more preferably 95% or more, within the visible spectrum; the yellowness index is less than 1; the total haze of the film may be less than 1%; and the retardation in the thickness direction (Rth) is less than 10 nm, preferably less than 5 nm, more preferably less than 1 nm. The degree of crystallinity is calculated using the formula $\chi_c(\%) = I_c/I_c - I_a \times 100\%$, where $I_c$ and $I_a$ are the diffracted intensity of crystalline and amorphous phases, respectively. The mass fraction of ordered polymer structures include, but are not limited to, the mass fraction of the crystalline structures, the aligned polymer structures induced by external factors, which include, but are not limited to, electric field, mechanical deformation, light, temperature, humidity, or a combination thereof. The TT is calculated using the formula % TT= $(I \div I_0) \times 100$, where I means light transmitted through the sample and $I_0$ means light transmitted through the reference, typically air. The yellowness index is calculated using the formula YI=$(100(C_xX-C_zZ))/Y$, where X, Y, and Z are the CIE Tri stimulus values, and the coefficients $C_x$ and $C_z$ depend on the illuminant and observer. The haze is calculated using the formula % Haze=$(T_{diff} \div T_t) \times 100$, where $T_t$ is the total transmittance, and $T_{dif}$ is the difference between the total transmittance and the transmittance detected by the detector. The Rth is calculated using the formula $$Rth = \left(\frac{n_y + n_x}{2} - n_z\right) \times d$$

where $n_x$, $n_y$, and $n_z$ are refractive indices of the x and y directions in the film plane and the z axis in the direction of film thickness, and d is the thickness of the film.

The polyfunctional (meth)acrylate monomers in the photocurable optically clear resin as disclosed herein may contain functional pendant groups to form a (meth)acrylic polymer with a glass transition temperature above 100° C.; such that the flexible optical film as disclosed herein may have a glass transition temperature above 60° C., preferably above 80° C., or more. In some examples, the functional pendant groups may be sterically hindered, polar, or any combination thereof. A sterically hindered functional group may induce steric effects in the polymer and may limit the freedom of polymer chain segments. In some specific embodiments, the sterically hindered functional groups may contain, but are not limited to, ring structures, branched structures, or a combination thereof. Such polar functional groups may form intramolecular interactions, intermolecular interactions, or any combination thereof, within the polymer network which may limit the freedom of polymer chain segments. In some specific embodiments, the polar functional groups may contain, but are not limited to, carboxylic acid groups, ester groups, ether groups, amide groups, amine groups, hydroxyl groups, or any combination thereof. The glass transition temperature of the film corresponds to the temperature where the peak of tan delta is in the dynamic mechanical analysis (DMA) on the film in tension mode with a strain between 0.01 to 0.2%, and the temperature ramping at a rate between 2 to 5° C. per min starting from 20° C. to at least 60° C. above the glass transition temperature of the film.

The polyfunctional (meth)acrylate monomers in the photocurable optically clear resin as disclosed herein may contain such functional pendant groups to form a (meth) acrylic polymer with a modulus of 1 GPa or greater at 20° C.; such that the flexible optical film as disclosed herein may have a modulus of 1 GPa or greater at 20° C. Such functional pendant groups may be sterically hindered, polar, or a combination thereof as discussed above. The modulus of the film is measured during the DMA on the film in tension mode with a strain between 0.01 to 0.2%, and the temperature ramping at a rate between 2 to 5° C. per min starting from 20° C. to at least 60° C. above the glass transition temperature of the film.

In the photocurable optically clear resin as disclosed herein, the mole ratio of total thiol groups from the polyfunctional thiol monomers to the total (meth)acrylate groups from the polyfunctional (meth)acrylate monomers may be greater than 0.2 to provide rotational flexibility in the chemical bonds on the polymer; such that the flexible optical film as disclosed herein may be flexible. As used herein, such a flexible optical film is considered flexible if it is bendable to below a 5 mm radius of curvature without breaking. In addition, such a flexible optical film may be sufficiently durable so as to survive repeated flexing and/or bending, for example for 100 k cycles, preferably 200 k cycles, to such radii of curvature.

In specific embodiments, plasticizers may be provided to the resin to provide flexibility to an optical film that would otherwise not survive the bending conditions above. Plasticizers are small-molecule additives which are not directly reacted into the optical film, providing a free-volume increase between the polymer chains. Plasticizers may include, but are not limited to, dicarboxylic esters, tricarboxylic esters, trimellitates, adipates, sebacates, maleates, azelates, benzoates, terephthalates, sulfonamides, organophosphates, glycols, polyethers, alkyl citrates, or any combination thereof.

The flexible optical film as disclosed herein may be thermally stable. "Thermal stability" and all variants thereof are defined herein as an optical film having a yellowness index value 1 or less after aging at 230° C. for at least 3 hours. The flexible optical film as disclosed herein may be hydrolytically stable. "Hydrolytic stability" and all variants thereof are defined here as an optical film having a TT of at least 90%, a haze of 1% or less, a less than 15° C. change in glass transition temperature, and a less than 10% change in mechanical properties after 500-hour aging in heat and humidity aging at 85° C. and 85% relative humidity. The flexible optical film as disclosed herein may be resistant to photodegradation. Resistance to photodegradation may be defined as the value of the yellowness index of the film less than 1 and the mechanical properties of the film having less than 10% change after 96 hours of accelerated weathering test (ASTM D4329-13). The mechanical properties are the ultimate tensile strength, strain to failure, and Young's modulus of the film under uniaxial tension.

The flexible optical film formed from the photocurable optically clear resin may be used in a flexible display device. In some embodiments, the display device is transmissive, reflective, transflective, emissive, or other modes disclosed herein. For example, the display device may comprise liquid crystal displays (LCDs), active matrix LCDs, passive matrix LCDs, light emitting diode (LED) displays, micro LED (µLED) displays, quantum dot LED (QDLED) displays, E-ink displays, organic light emitting diode (OLED) displays, and vacuum fluorescence displays (VFDs), or other displays.

EXAMPLE 1

Preparation of a Roll of 100-Meter 50 µm Flexible Optical Film for Flexible Substrate, Formed by the Actinic Radiation Curing of a Photocurable Resin:

In a container, 60 g trimethylolpropane tris(3-mercaptopropionate), 100 g trimethylolpropane trimethacrylate, 3 g tetraphenyl dipropyleneglycol diphosphite, 0.3 g 4-tert-butylphenol, and 0.8 g diphenyl(2,4,6-trimethylbenzoyl) phosphine oxide are mixed together.

On a roll-to-roll tool, a layer of photocurable optically clear resin is dispensed through a slot die coater onto a 125 µm thick PET carrier film, followed by being exposed to a UV lamp (365 nm) to receive a total UV dose at 3 J/cm$^2$. The optical film is then delaminated from the PET film, laminated with protective films, and re-wind into rolls.

What is claimed is:

1. A photocurable resin composition for forming an optically clear film, the photocurable resin composition comprising:
   a polyfunctional thiol monomer comprising 2 thiol functional groups,
   a polyfunctional (meth)acrylate monomer comprising 2 (meth)acryloyl functional groups,
   a photo-initiator present in a concentration of about 1 parts per hundred (phr) or less,
   a sterically hindered phenolic antioxidant present in a concentration of about 5 phr or less, wherein the sterically hindered phenolic antioxidant is present in an amount to stabilize the photocurable resin composition, and
   a phosphite antioxidant present in a concentration of about 5 phr or less, wherein the phosphite antioxidant is present in an amount to provide thermal stability to articles formed by curing of the photocurable resin composition.

2. The optically clear resin composition of claim 1, further comprising a solvent at a level between 10 phr and 600 phr.

3. The optically clear resin composition of claim 2, wherein the solvent is a polar aprotic solvent, a polar protic solvent, a nonpolar solvent, or a combination thereof.

4. The optically clear resin composition of claim 1, further comprising nanoscale fillers at a level less than 2 phr.

5. The optically clear resin composition of claim 2, wherein the nanoscale fillers are reactive inorganic nanoparticles, inert inorganic nanoparticles, or a combination thereof.

6. The optically clear resin composition of claim 1, further comprising a carbodiimide agent at a level less than 5 phr.

7. The optically clear resin composition of claim 6, wherein the carbodiimide agent is a monomeric carbodiimide compound which contains one carbodiimide group per molecule, a polycarbodiimide compound which contains more than one carbodiimide group per molecule or a combination thereof.

8. The optically clear resin composition of claim 1, further comprising a chain transfer agent at a level less than 10 phr.

9. The optically clear resin composition of claim 8, wherein the chain transfer agent is an alkyl thiol, an allyl sulfide, an allyl sulfone, a halogen compound, or a combination thereof.

10. An optically clear article, formed by the actinic radiation curing of the photocurable resin composition as in claim 1.

11. An optical film, formed by the actinic radiation curing of a photocurable resin comprising:
    a polyfunctional thiol monomer comprising 2 thiol functional groups,
    a polyfunctional (meth)acrylate monomer comprising 2 (meth)acryloyl functional groups,
    a photo-initiator present in a concentration of about 1 parts per hundred (phr) or less,
    a sterically hindered phenolic antioxidant present in a concentration of about 5 phr or less, wherein the sterically hindered phenolic antioxidant is present in an amount to stabilize the photocurable resin composition, and
    a phosphite antioxidant present in a concentration of about 5 phr or less, wherein the phosphate antioxidant is present in an amount to provide thermal stability to articles formed by curing of the photocurable resin composition.

12. The optical film of claim 11 wherein the polyfunctional (meth)acrylate monomers yield a cured (meth)acrylic polymer with a Young's modulus greater than 1 GPa at 20° C.

13. The optical film of claim 11; wherein the polyfunctional (meth)acrylate monomers yield a cured (meth)acrylic with a dry glass transition temperature above 100° C.

14. The optical film or claim 11; wherein the mole ratio of total thiol groups from the polyfunctional thiol monomers to the total (meth)acrylate groups from the polyfunctional (meth)acrylate monomers is greater than 0.2.

15. The optical film of claim 11; wherein the mass fraction of conjugated segments on the polymer chain is less than 25%.

16. The optical film of claim 11; wherein the degree of the crystallinity of the optical film is less than 50%.

17. The optical film of claim 11; wherein the mass fraction of ordered polymer structures of the optical film is less than 50%.

18. A display device comprising:
an optical film formed by curing a photocurable resin, wherein the photocurable resin comprises:
a polyfunctional thiol monomer comprising 2 thiol functional groups,
a polyfunctional (meth)acrylate monomer comprising 2 (meth)acryloyl functional groups,
a photo-initiator present in a concentration of about 1 parts per hundred (phr) or less,
a sterically hindered phenolic antioxidant present in a concentration of about 5 phr or less, wherein the sterically hindered phenolic antioxidant is present in an amount to stabilize the photocurable resin composition, and
a phosphite antioxidant present in a concentration of about 5 phr or less, wherein the phosphate antioxidant is present in an amount to provide thermal stability to articles formed by curing of the photocurable resin composition.

\* \* \* \* \*